United States Patent
Cui et al.

(10) Patent No.: US 11,152,677 B2
(45) Date of Patent: Oct. 19, 2021

(54) INTEGRATION OF SELF-BIASED MAGNETIC CIRCULATORS WITH MICROWAVE DEVICES

(71) Applicant: Qorvo US, Inc., Greensboro, NC (US)

(72) Inventors: Yongjie Cui, Plano, TX (US); Xing Gu, Allen, TX (US); Andrew Arthur Ketterson, Dallas, TX (US); Cathy Lee, Plano, TX (US); Xing Chen, Sunnyvale, CA (US)

(73) Assignee: Qorvo US, Inc., Greensboro, NC (US)

(*) Notice: Subject to any disclaimer, the term of this patent is extended or adjusted under 35 U.S.C. 154(b) by 21 days.

(21) Appl. No.: 16/429,790

(22) Filed: Jun. 3, 2019

(65) Prior Publication Data
US 2020/0153071 A1 May 14, 2020

Related U.S. Application Data

(60) Provisional application No. 62/759,972, filed on Nov. 12, 2018, provisional application No. 62/760,455, filed on Nov. 13, 2018.

(51) Int. Cl.
*H01P 1/383* (2006.01)
*H01L 21/306* (2006.01)
(Continued)

(52) U.S. Cl.
CPC .......... *H01P 1/383* (2013.01); *H01L 21/0254* (2013.01); *H01L 21/02378* (2013.01);
(Continued)

(58) Field of Classification Search
CPC .... H01P 1/383; H01P 11/00; H01L 21/30604; H01L 21/0254; H01L 21/02378;
(Continued)

(56) References Cited

U.S. PATENT DOCUMENTS

2011/0193649 A1* 8/2011 Popelka ................. H01P 1/387
333/1.1
2014/0323064 A1* 10/2014 McCarthy ............. H01P 1/383
455/77
(Continued)

FOREIGN PATENT DOCUMENTS

EP 0197476 A2 * 10/1986 ............. H01P 1/387
FR 2884971 A1 * 10/2006 ............. H01P 1/387

OTHER PUBLICATIONS

J. D. Adam et al., "K-band circulators on semiconductor wafers," 1996 IEEE MTT-S International Microwave Symposium Digest, San Francisco, CA, USA, 1996, pp. 113-115 vol. 1 (Year: 1996).*
(Continued)

*Primary Examiner* — Steven H Loke
*Assistant Examiner* — Juanita B Rhodes
(74) *Attorney, Agent, or Firm* — Withrow & Terranova, PLLC

(57) ABSTRACT

Integration of self-biased magnetic circulators with microwave devices is disclosed herein. In microwave and other high-frequency radio frequency (RF) applications, a magnetic circulator can be implemented with a smaller permanent magnet. Aspects disclosed herein include a process flow for producing a self-biased circulator in an integrated circuit chip. In this regard, a magnetic circulator junction can be fabricated on an active layer of a semiconductor wafer. A deep pocket or cavity is formed in an insulating substrate under the active layer. This cavity is then filled with a ferromagnetic material such that the circulator junction is self-biased within the integrated circuit chip, eliminating the need for an external magnet. The self-biased circulator provides high isolation between ports in a smaller integrated circuit.

20 Claims, 8 Drawing Sheets

(51) Int. Cl.
| | |
|---|---|
| H01L 27/06 | (2006.01) |
| H01L 23/528 | (2006.01) |
| H01L 23/66 | (2006.01) |
| H01L 21/8252 | (2006.01) |
| H01L 21/3205 | (2006.01) |
| H01P 11/00 | (2006.01) |
| H01L 21/02 | (2006.01) |
| H01L 29/20 | (2006.01) |
| H01L 21/683 | (2006.01) |

(52) U.S. Cl.
CPC .. *H01L 21/30604* (2013.01); *H01L 21/32051* (2013.01); *H01L 21/6835* (2013.01); *H01L 21/8252* (2013.01); *H01L 23/528* (2013.01); *H01L 23/66* (2013.01); *H01L 27/0605* (2013.01); *H01L 29/2003* (2013.01); *H01L 2221/6835* (2013.01); *H01L 2221/68359* (2013.01); *H01L 2223/6605* (2013.01); *H01P 11/00* (2013.01)

(58) Field of Classification Search
CPC ... H01L 27/0605; H01L 23/528; H01L 23/66; H01L 29/2003; H01L 21/8252; H01L 21/6835; H01L 21/32051; H01L 2221/6835; H01L 2223/6605; H01L 2221/68359; H01L 2221/68327; H01L 27/0617; H01L 29/4175; H01L 29/812; H01L 23/481; H01F 1/0072
See application file for complete search history.

(56) References Cited

U.S. PATENT DOCUMENTS

| | | | | |
|---|---|---|---|---|
| 2016/0306039 | A1* | 10/2016 | Selzler | G01S 13/951 |
| 2017/0293017 | A1* | 10/2017 | Evangelista | G01S 7/034 |
| 2019/0131681 | A1* | 5/2019 | Ferizovic | H01P 1/387 |

OTHER PUBLICATIONS

Adam, et al., "K-band Circulators on Semiconductor Wafers", IEEE MTT-S Digest, 1996, pp. 113-115.

Akaiwa, et al., "An Application of a Hexagonal Ferrite to a Millimeter-Wave Y Circulator," IEEE Transactions on Magnetics, vol. 10, Issue 2, Jun. 1974, pp. 374-378.

Boyajian, et al., "Coplanar Circulator Made from Composite Magnetic Material," MTT-S International Microwave Symposium Digest, Jun. 2011, IEEE, 4 pages.

Carignan, et al., "Ferromagnetic Nanowire Metamaterials: Theory and Applications", IEEE Transactions on Microwave Theory and Techniques, vol. 59, Issue 10, Oct. 2011, pp. 2568-2586.

Carignan, et al., "Magnetic anisotropy in arrays of Ni, CoFeB, and Ni/Cu nanowires", Journal of Applied Physics, vol. 102, 2007, American Institute of Physics, 10 pages.

Chao, et al., "Millimeter wave complementary metal-oxide-semiconductor on-chip hexagonal ferrite circulator", Journal of Applied Physics, vol. 115, 2014, AIP Publishing LLC, 13 pages.

Darques, et al., "Microwave circulator based on ferromagnetic nanowires in an alumina template", Nanotechnology, vol. 21, Issue 14, 2010, IOP Publishing Ltd, 4 pages.

Encinas-Oropesa, et al., "Dipolar interactions in arrays of nickel nanowires studied by ferromagnetic resonance", Physical Review B, vol. 63, 2001, The American Physical Society, 6 pages.

Fitchorov, et al., "Miniaturized, Low-cost, Self-biased Circulators for Space and Airborne Applications", Earth Science Technology Forum, Annapolis, Maryland, Jun. 15, 2016, 21 pages.

Hamoir, et al., "Control of Microwave Circulation Using Unbiased Ferromagnetic Nanowires Arrays," IEEE Transactions on Magnetics, vol. 49, Issue 7, Jul. 2013, pp. 4261-4264.

Laur, et al., "Self-Biased Y-Junction Circulators Using Lanthanum- and Cobalt-Substituted Strontium Hexaferrites" IEEE Transactions on Microwave Theory and Techniques, vol. 63, Issue 12, Dec. 2015, 6 pages.

Oliver, et al., "A Monolithically Single-Crystal Yttrium Iron Garnet/Silicon X-band Circulator", IEEE Transactions on Microwave Waves & Guided Wave Letters, vol. 7, Issue 8, 1 page.

Oliver, et al., "Integrated Self-Biased Hexaferrite Microstrip Circulators for Millimeter-Wavelength Applications," IEEE Transactions on Microwave Theory and Techniques, vol. 49, Issue 2, Feb. 2001, pp. 385-387.

O'Neil, et al., "Experimental Investigation of a Selfbiased microstrip circulator" IEEE Transactions on Microwave Theory and Techniques, vol. 57, Issue 7, Jul. 2009, pp. 1669-1674.

Saib, et al., "An Unbiased Integrated Microstrip Circulator Based on Magnetic Nanowired Substrate," IEEE Transactions on Microwave Theory and Techniques, vol. 53, Issue 6, Jun. 2005, pp. 2043-2049.

Shi, et al., "Applications of Single-Crystal Scandium Substituted Hexaferrite for Monolithic Millimeter-Wavelength Circulators," IEEE Transaction on Magnets, vol. 37, Issue 6, Nov. 2001, pp. 3941-3946.

Tsankov, et al., "Design of self-biased hexaferrite waveguide circulators", Journal of Applied Physics, vol. 73, Issue 10, May 1993, 3 pages.

Wang, et al., "Self Biased Y-Junction Circulator at Ku band," IEEE Microwave and Wireless Components Letters, vol. 21, Issue 6, Jun. 2011, pp. 292-294.

Weiss, et al., "New Self Biased Circulators", Applied Microwave, Fall 1990, p. 74-85.

Weiss, et al., "New Uniaxial-Ferrite Millimeter-Wave Junction Circulators", IEEE MTT-S Digest, vol. 1, 1989, pp. 145-148.

Yang, et al., "Static and Dynamic Magnetization of Gradient FeNi Alloy Nanowire", Scientific Reports, Feb. 2016, 9 pages.

Yoon, et al., "Preparation of High-Quality Hexaferrite Thick Films by an Improved Liquid Phase Epitaxy Deposition Technique," IEEE Transactions on Magnetics, vol. 39, Issue 5, Sep. 2003, pp. 3163-3165.

Zeina, et al., "Self-Biasing Circulators Operating at Ka-Band Utilizing M-Type Hexagonal Ferrites," IEEE Transactions on Magnetics, vol. 28, Issue 5, Sep. 1992, pp. 3219-3221.

Zhou, et al., "Design of Self-Biased Coplanar Circulator with Ferromagnetic Nanowires", IEEE Radio and Wireless Symposium, 2018, pp. 240-242.

\* cited by examiner

United States Patent

INTEGRATION OF SELF-BIASED MAGNETIC CIRCULATORS WITH MICROWAVE DEVICES

RELATED APPLICATIONS

This application claims the benefit of provisional patent application Ser. No. 62/759,972, filed Nov. 12, 2018, and provisional patent application Ser. No. 62/760,455, filed Nov. 13, 2018, the disclosures of which are hereby incorporated herein by reference in their entireties.

GOVERNMENT SUPPORT

This invention was made with government funds under contract number W911NF-17-0033 awarded by the Defense Advanced Research Projects Agency. The U.S. Government may have rights in this invention.

FIELD OF THE DISCLOSURE

This application relates to radio frequency circulators.

BACKGROUND

In radio frequency (RF) transceiver systems, a magnetic circulator is frequently used to enable simultaneous signal transmission and reception over a single antenna. The magnetic circulator routes the signals between a transmit port, an antenna port, and a receive port while providing isolation between the transmit port and the receive port. The magnetic circulator includes a permanent magnet which causes signals to pass through its material along one direction, such that signals travel from the transmit port to the antenna port and from the antenna port to the receive port.

The size of a magnetic circulator is inversely proportional to frequency of the signals which propagate through it and can become very large for lower frequency applications. Traditional magnetic circulators are therefore generally too large to integrate within portable electronic devices.

SUMMARY

The present application relates to integration of self-biased magnetic circulators with microwave devices. In microwave and other high-frequency radio frequency (RF) applications, a magnetic circulator can be implemented with a smaller permanent magnet. Aspects disclosed herein include a process flow for producing a self-biased circulator in an integrated circuit chip. In this regard, a magnetic circulator junction can be fabricated on an active layer of a semiconductor wafer. A deep pocket or cavity is formed in an insulating substrate under the active layer. This cavity is then filled with a ferromagnetic material such that the circulator junction is self-biased within the integrated circuit chip, eliminating the need for an external magnet. The self-biased circulator provides high isolation between ports in a smaller integrated circuit.

An exemplary aspect relates to a method for producing a self-biased magnetic circulator. The method includes providing an integrated circuit comprising an active layer over an insulating substrate and forming a circulator metal junction over the active layer. The method further includes removing a portion of the insulating substrate to form a cavity under the circulator metal junction and placing a magnet within the cavity to form a magnetic circulator with the circulator metal junction and the magnet.

Another exemplary aspect relates to an integrated circuit. The integrated circuit includes an active layer disposed on an insulating substrate and a magnetic circulator comprising a plurality of magnets disposed in cavities formed in the insulating substrate.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
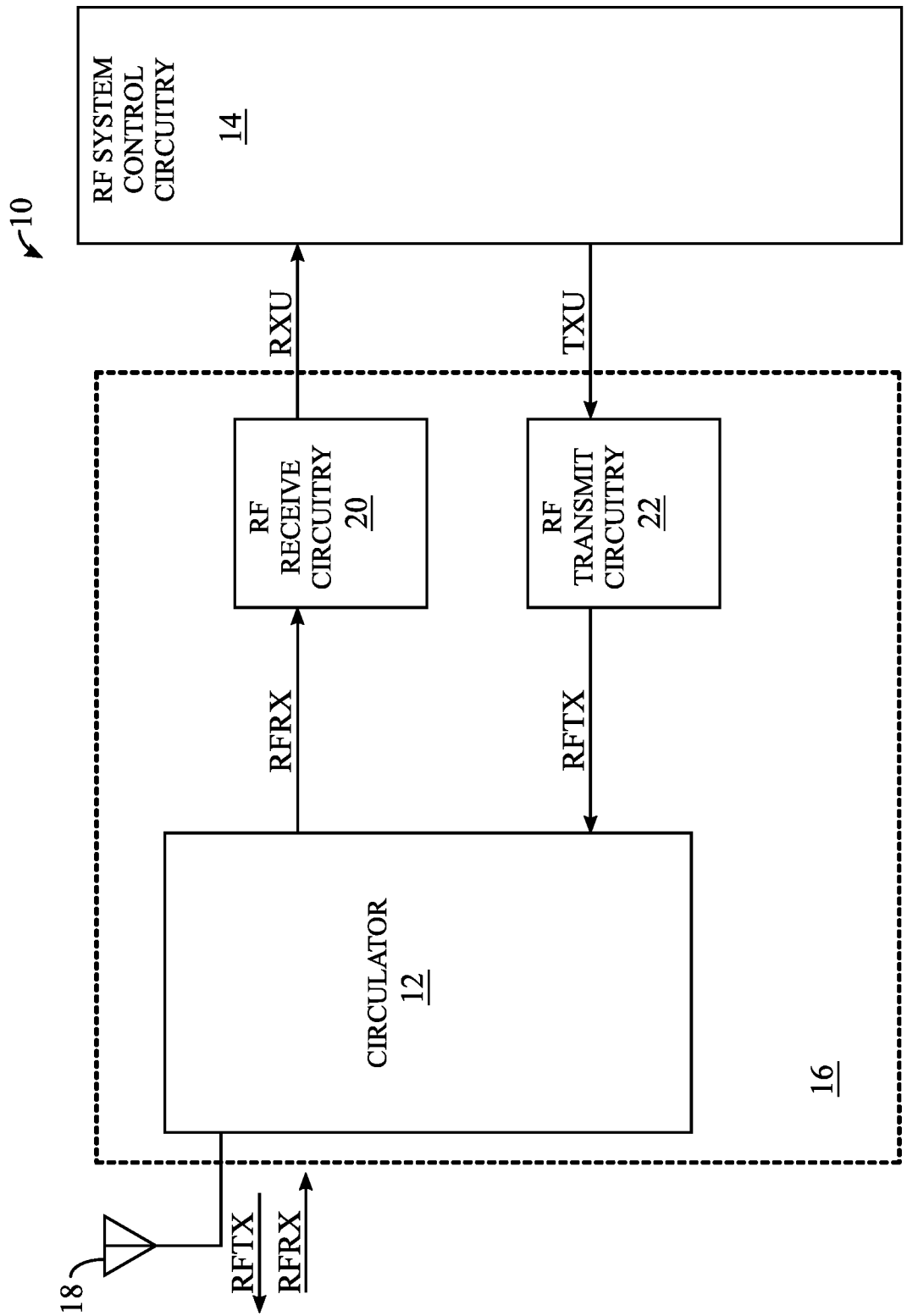
FIG. 1 is a schematic diagram of radio frequency (RF) communications circuitry which includes a circulator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present application relates to integration of self-biased magnetic circulators with microwave devices. In microwave and other high-frequency radio frequency (RF) applications, a magnetic circulator can be implemented with a smaller permanent magnet. Aspects disclosed herein include a process flow for producing a self-biased circulator in an integrated circuit chip. In this regard, a magnetic circulator junction can be fabricated on an active layer of a semiconductor wafer. A deep pocket or cavity is formed in an insulating substrate under the active layer. This cavity is then filled with a ferromagnetic material such that the circulator junction is self-biased within the integrated circuit chip, eliminating the need for an external magnet. The self-biased circulator provides high isolation between ports in a small integrated circuit.

FIG. 1 is a schematic diagram of RF communications circuitry 10 which includes a circulator 12. The RF communications circuitry 10 includes RF system control circuitry 14, RF front-end circuitry 16, and an RF antenna 18. The RF front-end circuitry 16 includes the circulator 12, RF receive circuitry 20, and RF transmit circuitry 22. The circulator 12 facilitates simultaneous signal transmission and reception over the RF antenna 18. In this regard, the circulator 12 facilitates sending an RF transmit signal RFTX from the RF transmit circuitry 22 to the RF antenna 18 while sending an RF receive signal RFRX from the RF antenna 18 to the RF receive circuitry 20. The circulator 12 also provides isolation between the RF receive circuitry 20 and RF transmit circuitry 22.

In an exemplary aspect, the RF system control circuitry 14 provides an upstream transmit signal TXU to the RF transmit circuitry 22. The RF transmit circuitry 22 processes the upstream transmit signal TXU to provide the RF transmit signal RFTX to the circulator 12. The RF transmit circuitry 22 may include up-conversion circuitry, amplification circuitry, power supply circuitry, filtering circuitry, switching circuitry, combining circuitry, splitting circuitry, dividing circuitry, clocking circuitry, the like, or any combination thereof to process the upstream transmit signal TXU. The circulator 12, in turn, forwards the RF transmit signal RFTX to the RF antenna 18 to be transmitted wirelessly.

The circulator 12 also forwards the RF receive signal RFRX received wirelessly by the RF antenna 18 to the RF receive circuitry 20. The RF receive circuitry 20 receives and processes the RF receive signal RFRX to provide an upstream receive signal RXU. The RF receive circuitry 20 may include down-conversion circuitry, amplification circuitry, low noise amplification circuitry, power supply circuitry, filtering circuitry, switching circuitry, combining circuitry, splitting circuitry, dividing circuitry, clocking circuitry, the like, or any combination thereof. It should be understood that the RF transmit circuitry 22 and the RF receive circuitry 20 are illustrated between the circulator 12 and the RF system control circuitry 14 for illustrative purposes. In other examples, at least some of the RF transmit circuitry 22 and/or the RF receive circuitry 20 may be positioned between the circulator 12 and the RF antenna 18.

The circulator 12 provides a high level of isolation between the RF receive circuitry 20 and the RF transmit circuitry 22. This may be of particular benefit to the RF receive circuitry 20. For example, the RF transmit signal RFTX may be much higher power than the RF receive signal RFRX, and the circulator 12 may prevent damage to sensitive components in the RF receive circuitry 20 from the RF transmit signal RFTX. In addition, amplifiers in the RF receive circuitry 20 may be prevented from amplifying portions of the RF transmit signal RFTX, which may drown out or otherwise interfere with processing of the RF receive signal RFRX.

FIGS. 2A-2H illustrate a process flow for producing a self-biased circulator 12 in an integrated circuit 24. The integrated circuit 24 includes the self-biased circulator 12, which provides high isolation between ports (e.g., between a receive port coupled to the RF receive circuitry 20 and a transmit port coupled to the RF transmit circuitry 22, as described above). The integrated circuit 24 further includes some or all of the components of the RF front-end circuitry 16 described above with respect to FIG. 1.

Figure 2A:
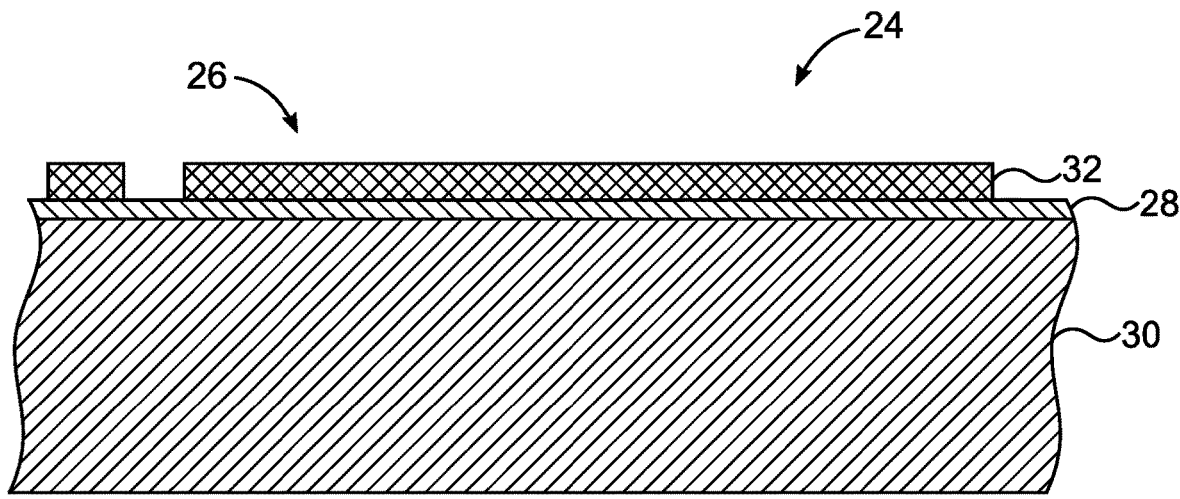
FIG. 2A is a cross-sectional view of an exemplary integrated circuit with a circulator metal junction formed over an active layer.

FIG. 2A is a cross-sectional view of an exemplary integrated circuit 24 with a circulator metal junction 26 formed over an active layer 28. The integrated circuit 24 is a semiconductor device having a layered structure, including an insulating substrate 30, the active layer 28 formed over the insulating substrate 30, and a metallization layer 32 formed over the active layer 28.

Figure 3:
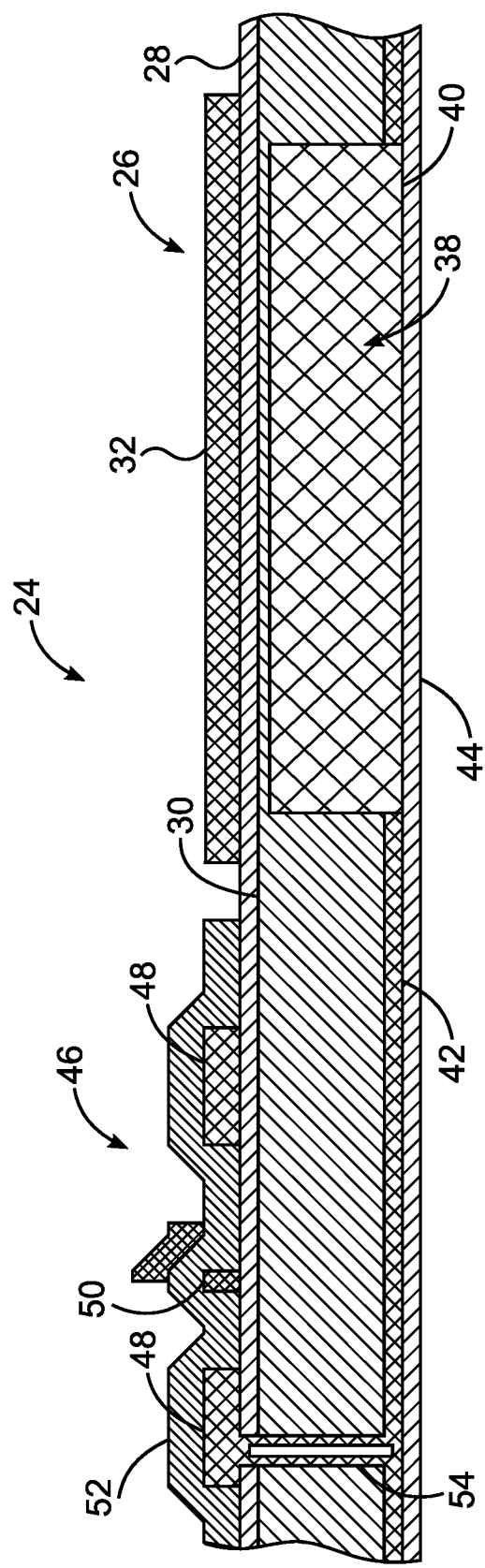
FIG. 3 is a cross-sectional view of the exemplary integrated circuit of FIGS. 2A-2H, illustrated with additional components.

In an exemplary aspect, the integrated circuit 24 includes the self-biased circulator 12, as well as additional semiconductor devices, such as RF transistors (see, e.g., FIG. 3). The active layer 28 can be an epitaxial layer, comprising at least one of gallium nitride (GaN), gallium arsenide (GaAs), or another appropriate semiconductor material. The active layer 28 may include multiple epitaxial layers as appropriate to form the additional semiconductor devices. The insulating substrate 30 can be an appropriate semiconductor substrate, such as silicon carbide (SiC), silicon (Si), silicon oxide (SiO), or another appropriate insulating material.

The metallization layer 32 is patterned to form the circulator metal junction 26 and transmission lines (e.g., to couple to the RF antenna 18, RF receive circuitry 20, and/or RF transmit circuitry 22 of FIG. 1). The metallization layer 32 can also be patterned to form other components, such as transistor gates, additional transmission lines, and so on. The metallization layer 32 can be formed from a conductive material, (e.g., copper, gold, silver, and/or aluminum) using an appropriate technique (e.g., sputtering, vapor deposition, printing, plating, and so on).

Figure 2B:
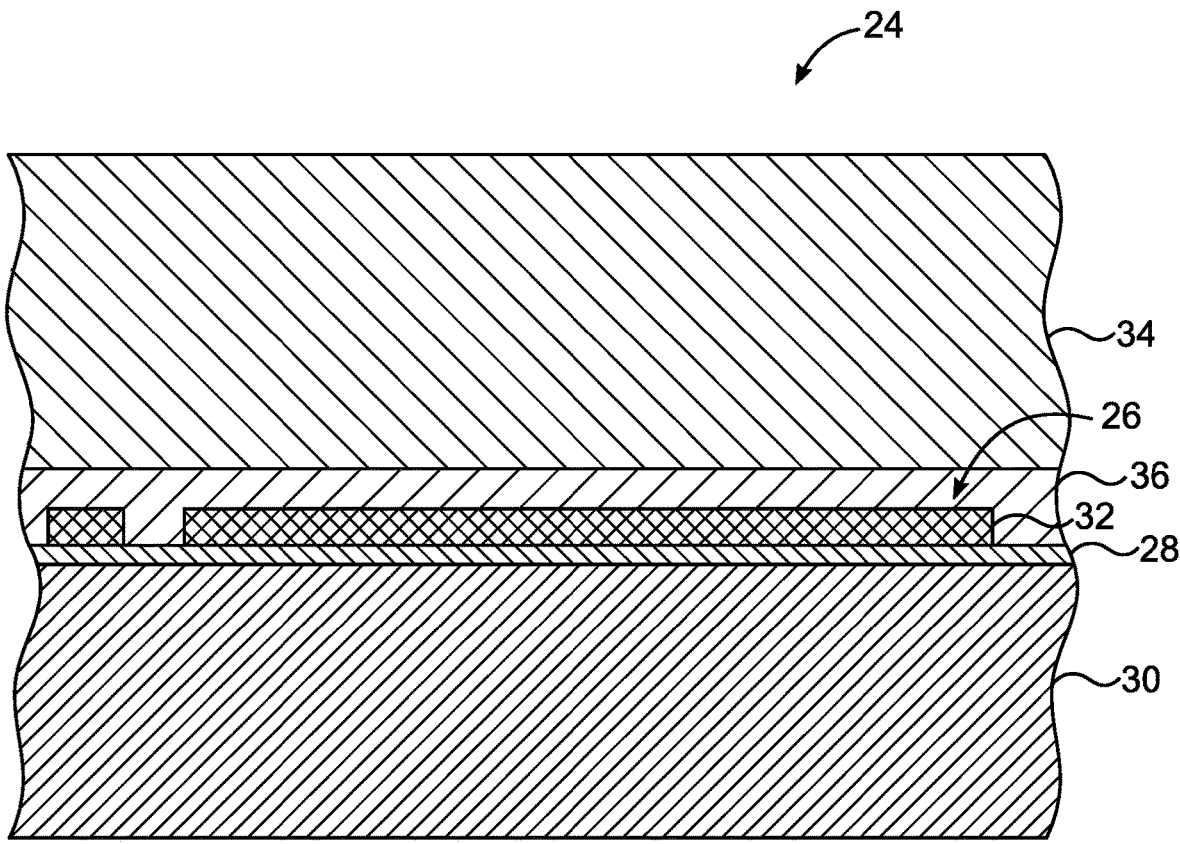
FIG. 2B is a cross-sectional view of the exemplary integrated circuit of FIG. 2A, illustrating mounting on a carrier substrate.

FIG. 2B is a cross-sectional view of the exemplary integrated circuit 24 of FIG. 2A, illustrating mounting on a carrier substrate 34. In order to facilitate further processing, the integrated circuit 24 may be flipped and mounted on the carrier substrate 34. That is, a metal disc carrier or other appropriate carrier substrate 34 can be coupled to the "front side" of the integrated circuit 24, with an adhesive layer 36 coupling the carrier substrate 34 to the metallization layer 32 and/or the active layer 28.

Figure 2C:
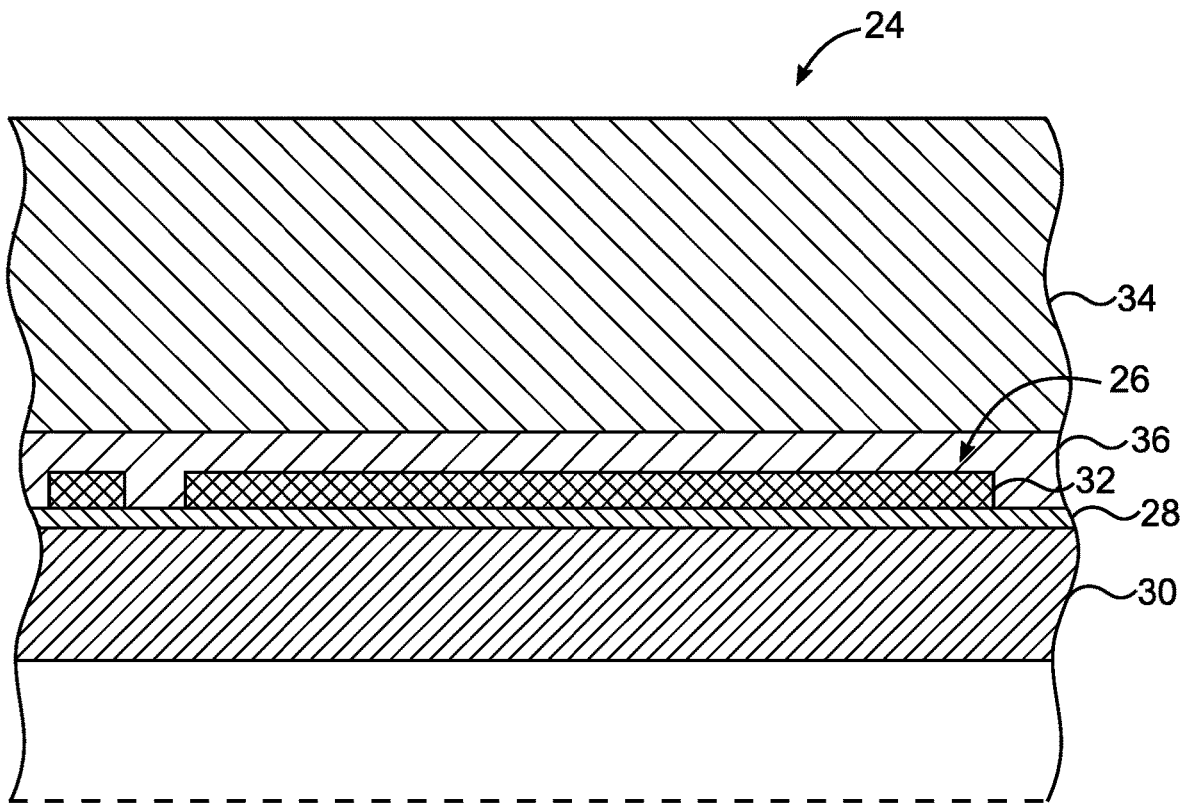
FIG. 2C is a cross-sectional view of the exemplary integrated circuit of FIG. 2B, illustrating thinning of an insulating substrate.

FIG. 2C is a cross-sectional view of the exemplary integrated circuit 24 of FIG. 2B, illustrating thinning of the insulating substrate 30. After mounting to the carrier substrate 34, in some examples the wafer of the integrated circuit 24 is thinned in order to further reduce overall size of the integrated circuit 24. In this regard, a bottom portion of the insulating substrate 30 may be removed through an appropriate technique, such as mechanical removal (e.g., grinding and/or polishing). In some examples, a thickness of the insulating substrate 30 after thinning can be approximately 100 microns (μm) (e.g., 90 μm to 110 μm). In other examples, the thickness may be different, and may be based on a thickness of a later-inserted magnet (as further described below with respect to FIG. 2E).

Figure 2D:
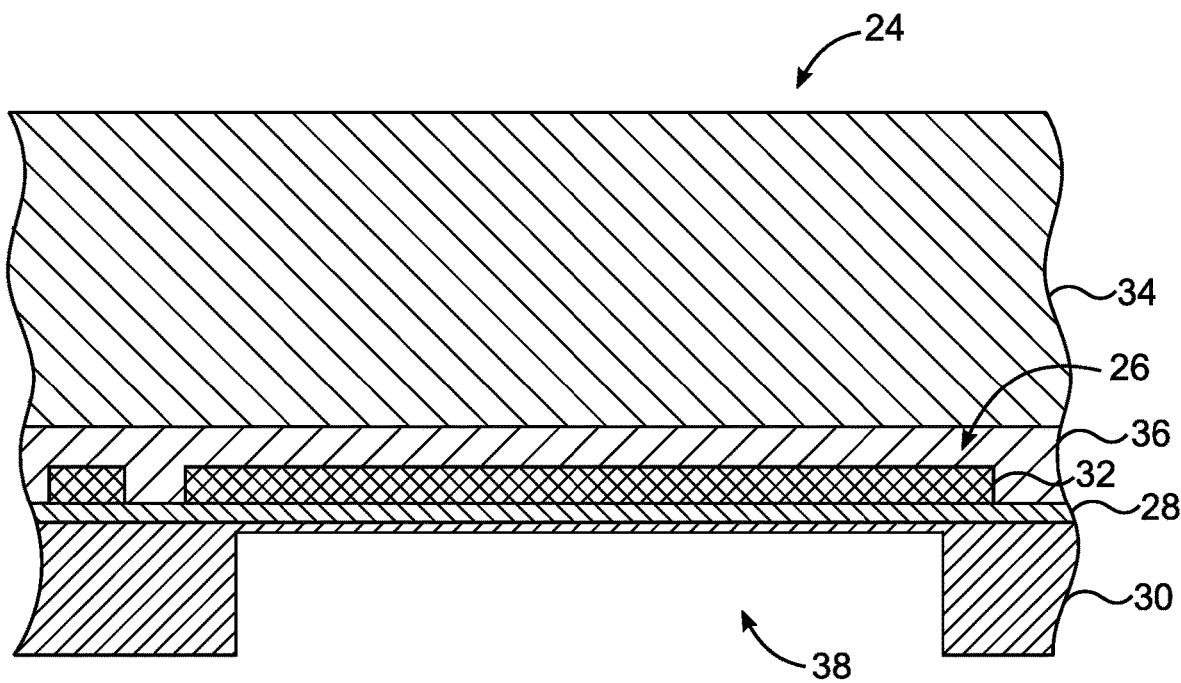
FIG. 2D is a cross-sectional view of the exemplary integrated circuit of FIG. 2C, illustrating formation of a cavity in the insulating substrate.

FIG. 2D is a cross-sectional view of the exemplary integrated circuit 24 of FIG. 2C, illustrating formation of a cavity 38 in the insulating substrate 30. A portion of the insulating substrate 30 is removed to form a deep pocket or cavity 38 below the active layer 28, and in some examples a plurality of cavities 38 are formed in the insulating substrate 30. In an exemplary aspect, the insulating substrate 30 is etched to a depth of between 85 μm and 100 μm, such that the insulating substrate 30 in the target region of the cavity 38 is etched to a thickness of 15 μm or less. Through the same or another process (e.g., chemical, mechanical, etc.), ground vias may be formed through the insulating substrate 30 (as further described below with respect to FIG. 3).

Figure 2E:
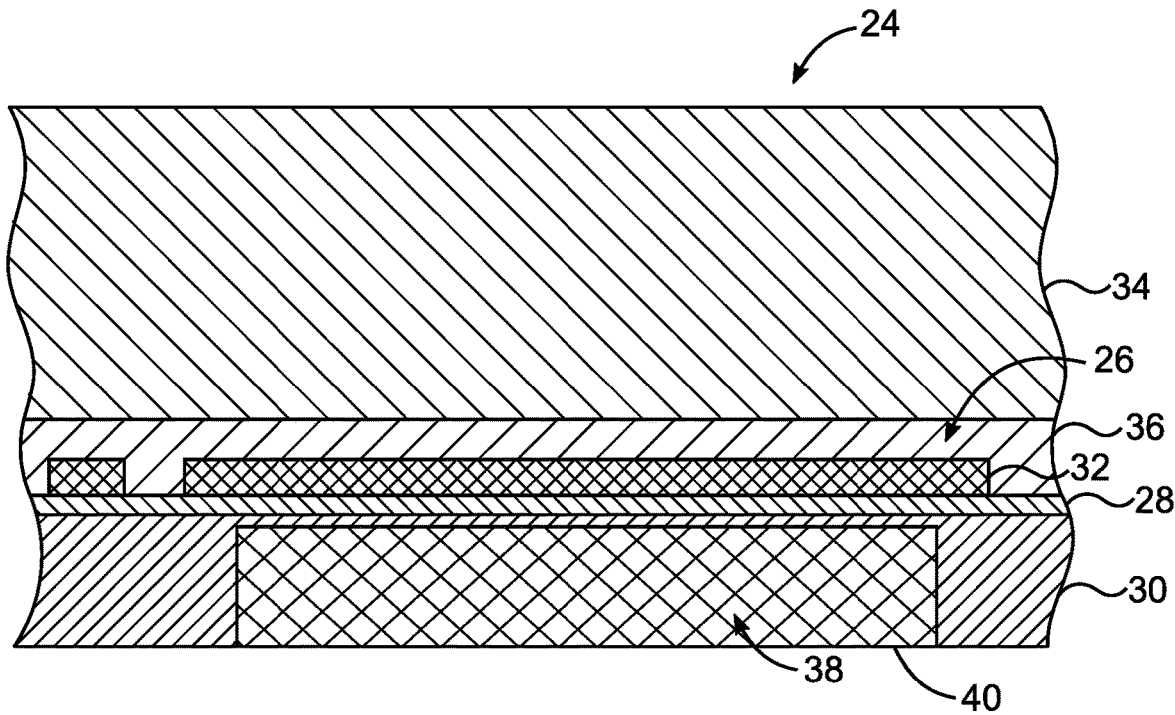
FIG. 2E is a cross-sectional view of the exemplary integrated circuit of FIG. 2D, illustrating placing a magnet within the cavity.

FIG. 2E is a cross-sectional view of the exemplary integrated circuit 24 of FIG. 2D, illustrating placing a magnet 40 within the cavity 38. After the cavity 38 is formed in the insulating substrate 30, a magnet 40 is placed in the cavity 38 to form a magnetic circulator with the active layer 28 and the magnet 40 (e.g., with the circulator metal junction 26 in the metallization layer 32). In some examples, the magnet 40 fills the cavity 38 and in other examples the cavity 38 is filed by the magnet 40 along with an adhesive or other material.

The magnet 40 can be formed from a non-conducting magnetic material, a conducting magnetic material, a composite magnetic material, or a combination of these. In an exemplary aspect, the magnet 40 is formed from a ferromagnetic material, such as a magnetic nano-composite (MNC) including at least one of iron-nickel (FeNi) nanowires or iron-cobalt (FeCo) nanowires. The MNC (or other magnetic material) can be formed in a separate process, singulated by laser dicing or another technique, and coupled to the insulating substrate 30 (e.g., via a dielectric adhesive). In some examples, the magnet 40 can be placed within the cavity 38 via growth or deposition in the cavity 38, ink jet deposition, screen printing, pick and place, or another appropriate technique.

The size and shape of the magnet 40 can depend on an operating RF frequency range of the circulator 12 in the integrated circuit 24. In some examples, the thickness of the magnet 40 can vary, which can result in a different depth of the cavity 38 and/or thickness of the insulating substrate 30. In some examples, a length, width, radius, etc. defined transverse to the thickness of the magnet 40 can vary with or without changes in the thickness of the magnet 40.

Figure 2F:
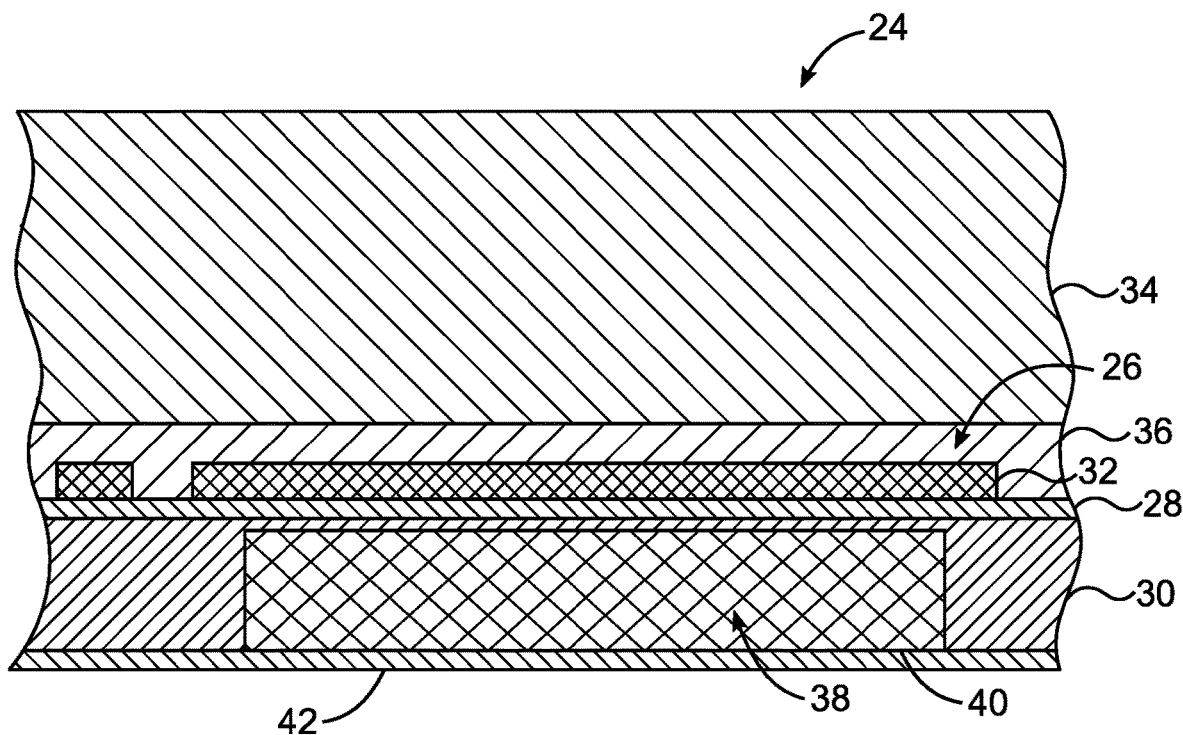
FIG. 2F is a cross-sectional view of the exemplary integrated circuit of FIG. 2E, illustrating forming a ground layer.

FIG. 2F is a cross-sectional view of the exemplary integrated circuit 24 of FIG. 2E, illustrating forming a ground layer 42. The ground layer 42 can be deposited as a ground plane covering a bottom surface of the insulating substrate 30 and the magnet(s) 40. In some examples, the ground layer 42 can be patterned, covering only some of the integrated circuit 24. The ground layer 42 can further be in contact with or otherwise electrically coupled to ground vias through the insulating substrate 30, as described further below with respect to FIG. 3. The ground layer 42 can be formed from a conductive material, (e.g., the same or a different conductive material as the metallization layer 32) using an appropriate technique (e.g., the same or a different technique as the metallization layer 32).

Figure 2G:
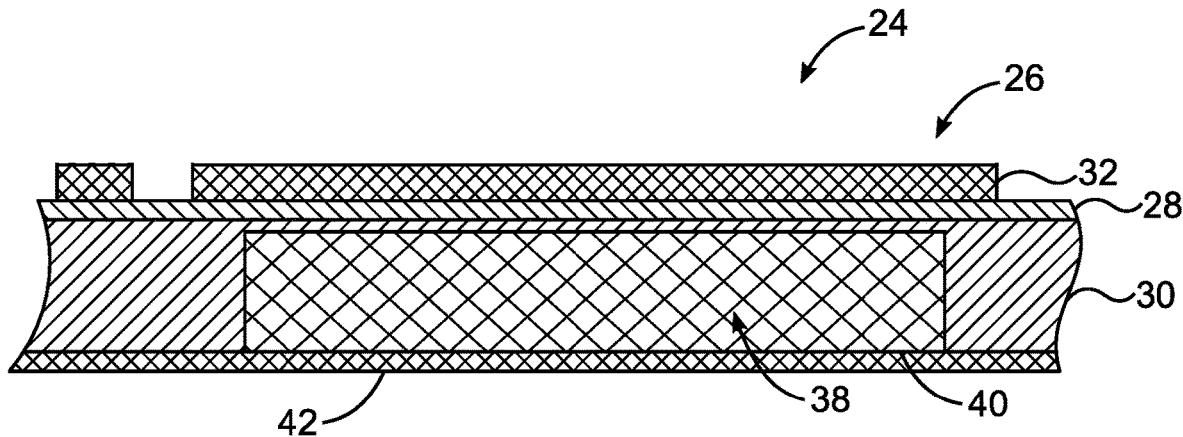
FIG. 2G is a cross-sectional view of the exemplary integrated circuit of FIG. 2F, illustrating removal of the carrier substrate.

FIG. 2G is a cross-sectional view of the exemplary integrated circuit 24 of FIG. 2F, illustrating removal of the carrier substrate 34. With the integrated circuit 24 complete, including the magnet 40 and the ground layer 42, the carrier substrate 34 and the adhesive layer 36 can be removed. The wafer of the integrated circuit 24 can also singulated (e.g., laser diced before or after removal of the carrier substrate 34) and packaged into an RF module, integrated circuit (IC) package, or similar device.

Figure 2H:
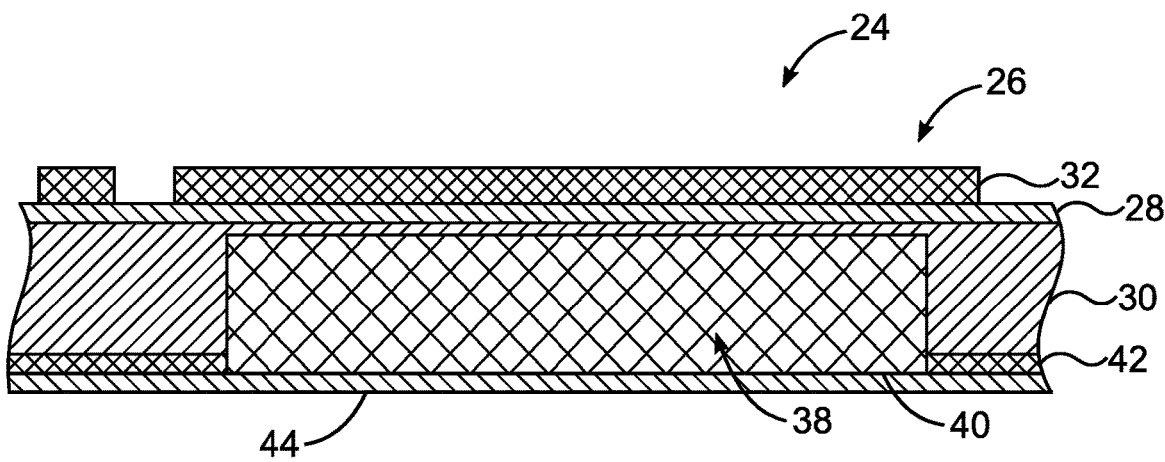
FIG. 2H is a cross-sectional view of the exemplary integrated circuit of FIG. 2E, illustrating an alternative ground layer formed in multiple steps.

FIG. 2H is a cross-sectional view of the exemplary integrated circuit 24 of FIG. 2E, illustrating an alternative ground layer formed in multiple steps. In contrast with the examples depicted in FIGS. 2F and 2G, a first ground layer 42 can be deposited over a bottom surface of the insulating substrate 30 (e.g., where the magnet(s) 40 have a thickness which exceeds the thickness of the insulating substrate 30). A second ground layer 44 is deposited over the first ground layer 42 and a bottom surface of the magnet(s) 40. In some examples, the first ground layer 42 and the second ground layer 44 are formed from a common conductive material. In some examples, the first ground layer 42 is formed from a first conductive material and the second ground layer 44 is formed from a second, different conductive material (e.g., a material with corrosion resistive or other desirable properties).

FIG. 3 is a cross-sectional view of the exemplary integrated circuit 24 of FIGS. 2A-2H, illustrated with additional components. The integrated circuit 24 illustrated in FIG. 3 incorporates one or more self-biased circulator metal junctions 26. The circulator metal junction 26 is fabricated in the metallization layer 32 over the active layer 28 of a semiconductor wafer. The cavity 38 is formed in the insulating substrate 30 under the active layer 28 and filled with a ferromagnetic material (e.g., the magnet 40).

In an exemplary aspect, the integrated circuit 24 includes the self-biased circulator metal junction 26, as well as additional semiconductor devices, such as an RF transistor 46. The RF transistor 46 is formed with an appropriate technique, including forming one or more N-type wells and/or P-type wells in the active layer 28. The metallization layer 32 can also include one or more transistor contacts 48 and transistor gates 50, which can be deposited in a same process as the circulator metal junction 26. In some examples, a dielectric layer 52 can be deposited over some or all of the metallization layer 32 (e.g., over the RF transistor 46). In some examples, one or more vias 54 can connect some of the transistor contacts 48 (or other components of the integrated circuit 24) to the first ground layer 42 and/or the second ground layer 44.

In this manner, a compact integrated circuit 24 is produced which includes a high isolation circulator (e.g., circulator 12 in FIG. 1) with additional components of an RF front end (e.g., RF front end circuitry 16 in FIG. 1). In an exemplary aspect, the integrated circuit 24 is configured to receive microwave and/or other high-frequency RF signals.

Figure 4A:
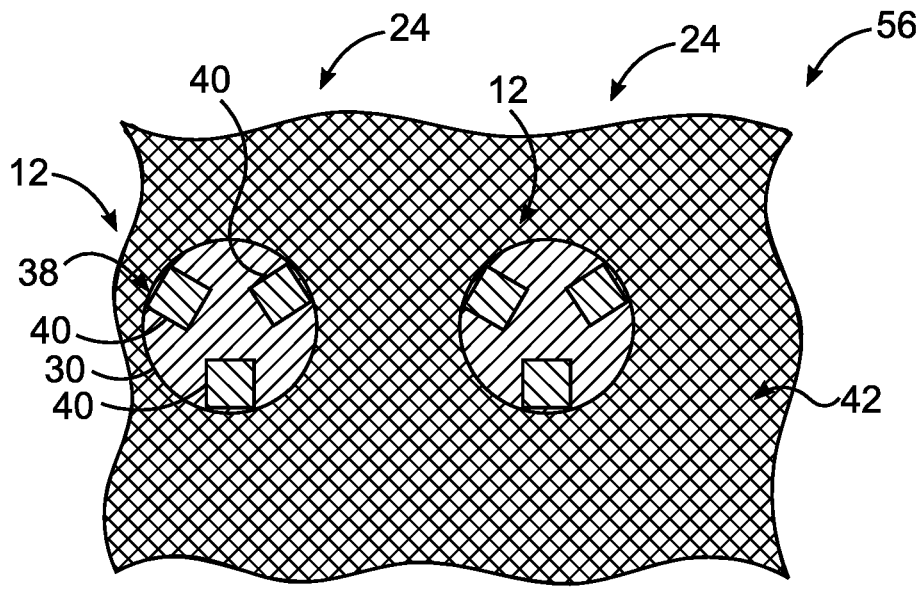
FIG. 4A is a bottom side view of a semiconductor wafer including the exemplary integrated circuit of FIGS. 2A-2H.

FIG. 4A is a bottom side view of a semiconductor wafer 56 including the exemplary integrated circuit 24 of FIGS. 2A-2H. The semiconductor wafer 56 can be fabricated with multiple integrated circuits 24, each having at least one circulator 12. Each circulator 12 includes multiple (e.g., 3) magnets 40 within cavities 38 in the insulating substrate 30. The ground layer 42 (e.g., the first ground layer 42) can cover the insulating substrate 30.

Figure 4B:
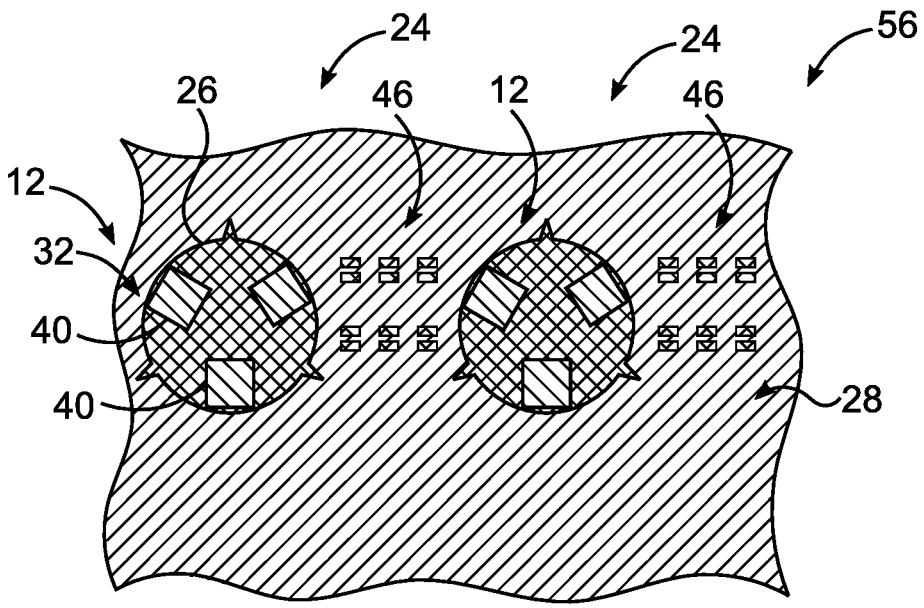
FIG. 4B is a top side view of the wafer of FIG. 4A.

FIG. 4B is a top side view of the semiconductor wafer 56 of FIG. 4A. As further illustrated, each integrated circuit 24 can include the circulator metal junction 26 in the metallization layer 32 over the active layer 28. In addition, each integrated circuit 24 can include one or more RF transistors 46 and/or other components of the RF front end. In this regard, the semiconductor wafer 56 can be laser diced or otherwise divided to provide multiple integrated circuits 24 which include the circulator 12 and some or all components of an RF front end in a compact package.

Figure 5:
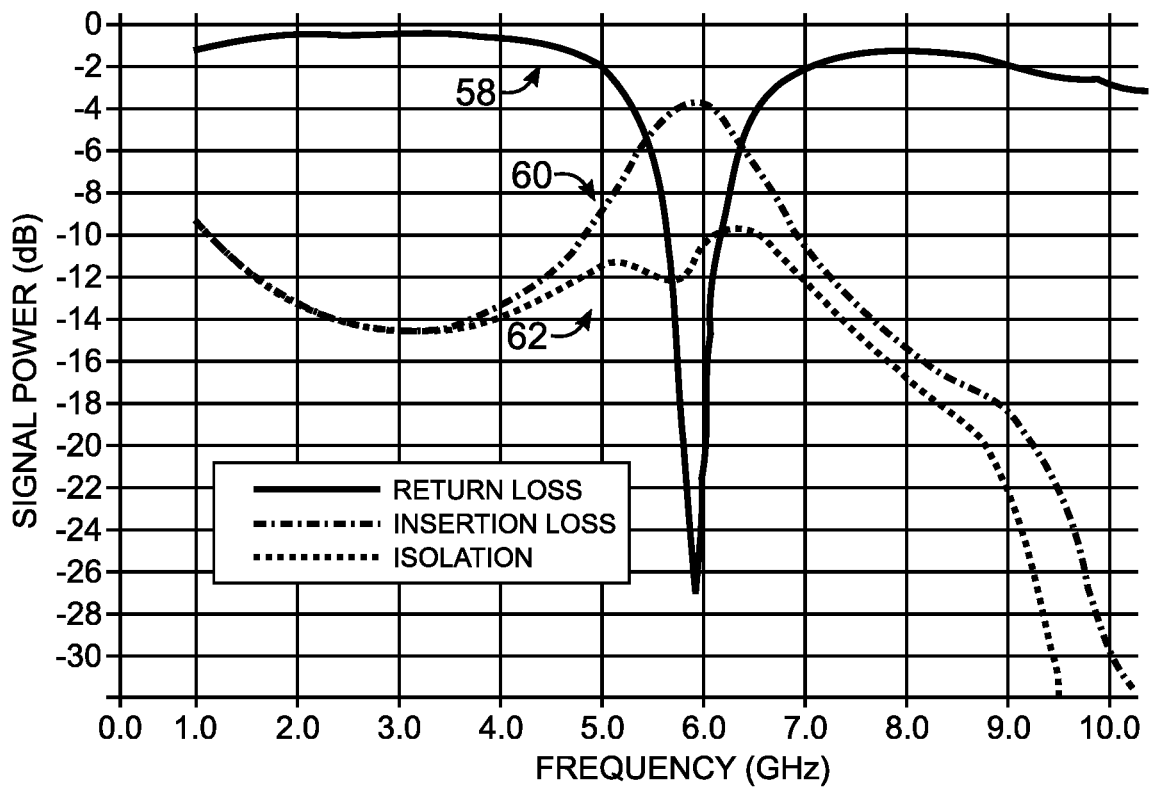
FIG. 5 is a graphical representation of performance of an exemplary circulator.

FIG. 5 is a graphical representation of performance of an exemplary circulator 12. The circulator 12 of FIG. 5 has a 5.8 millimeter (mm) diameter, and its operational frequency is 5.9 gigahertz (GHz) (e.g., microwave C-band). As illustrated in FIG. 5, at 5.9 GHz, the circulator 12 has a return loss 58 of 25 decibels (dB), an insertion loss 60 of 3.7 dB, and 11.2 dB isolation 62.

Figure 6:
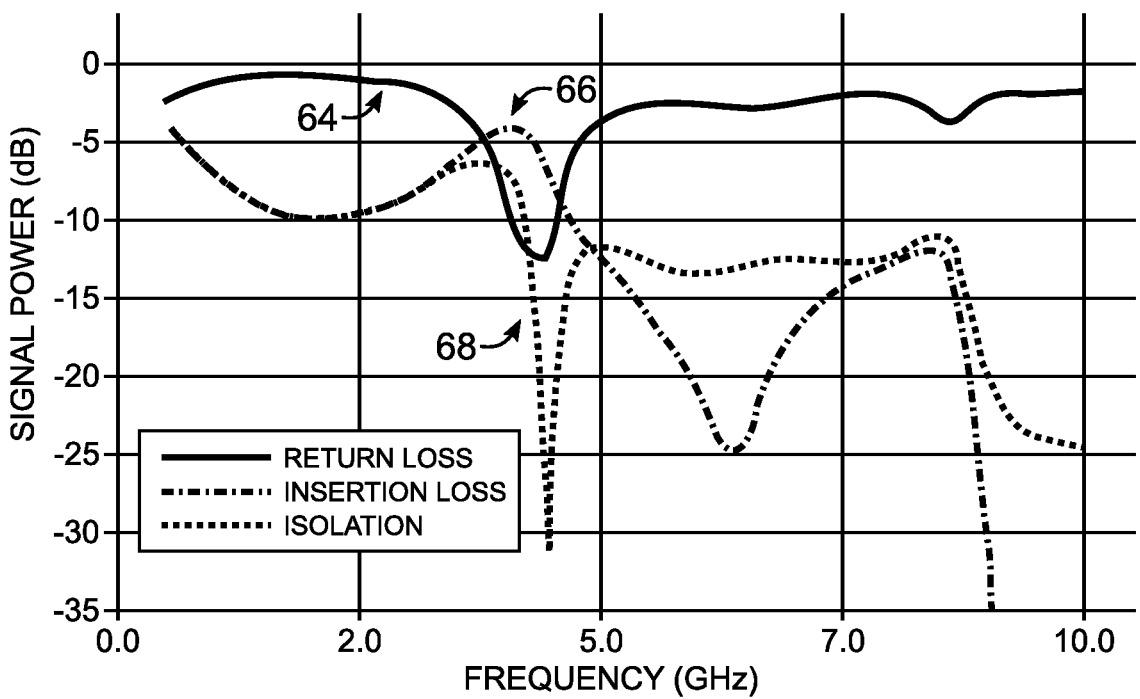
FIG. 6 is a graphical representation of performance of another exemplary circulator.

FIG. 6 is a graphical representation of performance of another exemplary circulator 12. The circulator 12 of FIG. 6 has a 4.2 mm diameter, and its operational frequency is 8.7 GHz (e.g., microwave X-band). As illustrated in FIG. 6, at 8.7 GHz, the circulator 12 has a return loss 64 of 13 dB, an insertion loss 66 of 5.3 dB, and 15.1 dB isolation 68. It should be understood that other embodiments can be designed to operate at different frequencies while maintaining a small, integrated package with high isolation.

Those skilled in the art will recognize improvements and modifications to the preferred embodiments of the present disclosure. All such improvements and modifications are considered within the scope of the concepts disclosed herein and the claims that follow.

What is claimed is:

1. A method for producing a self-biased magnetic circulator, comprising:
   providing an integrated circuit in a semiconductor wafer, the semiconductor wafer comprising an active semiconductor layer over an insulating semiconductor substrate;
   forming a circulator metal junction over the active semiconductor layer;
   removing a portion of the insulating semiconductor substrate to form a cavity under the circulator metal junction and the active semiconductor layer; and
   placing a magnet within the cavity to form a magnetic circulator with the circulator metal junction and the magnet.

2. The method of claim 1, wherein placing the magnet comprises:
   forming the magnet from a magnetic material; and
   bonding the magnet to the cavity.

3. The method of claim 2, wherein the magnetic material comprises at least one of a non-conducting magnetic material, a conducting magnetic material, and a composite magnetic material.

4. The method of claim 1, wherein placing the magnet comprises filling the cavity with a ferromagnetic material.

5. The method of claim 1, wherein removing the portion of the insulating semiconductor substrate comprises etching the insulating semiconductor substrate within a target region of the integrated circuit.

6. The method of claim 5, wherein the portion of the insulating semiconductor substrate is etched to a thickness of 15 microns (μm) or less.

7. The method of claim 1, further comprising depositing a ground layer covering a bottom surface of the insulating semiconductor substrate and a bottom surface of the magnet.

8. The method of claim 1, wherein providing the integrated circuit comprises depositing the active semiconductor layer over the insulating semiconductor substrate to form additional radio frequency (RF) circuitry.

9. The method of claim 8, wherein providing the integrated circuit further comprises forming a metallization layer over the active semiconductor layer which includes the circulator metal junction.

10. The method of claim 1, wherein:
   the active semiconductor layer comprises gallium nitride (GaN); and
   the insulating semiconductor substrate comprises silicon carbide (SiC).

11. An integrated circuit, comprising:
   a semiconductor wafer comprising an active semiconductor layer disposed on an insulating semiconductor substrate; and
   a magnetic circulator comprising:
      a plurality of magnets disposed in cavities formed in the insulating semiconductor substrate under the active semiconductor layer; and
      a circulator metal junction disposed on the active semiconductor layer over the plurality of magnets.

12. The integrated circuit of claim 11, wherein the active semiconductor layer comprises a plurality of radio frequency (RF) transistors.

13. The integrated circuit of claim 12, wherein the magnetic circulator and the plurality of RF transistors comprise at least a portion of an RF front end.

14. The integrated circuit of claim 12, further comprising a metallization layer disposed over the active semiconductor layer and defining signal lines connecting the magnetic circulator to the plurality of RF transistors.

15. The integrated circuit of claim 14, further comprising a ground layer disposed under the insulating semiconductor substrate and in contact with the plurality of magnets.

16. The integrated circuit of claim 11, wherein the plurality of magnets comprise at least one of a non-conducting magnetic material, a conducting magnetic material, and a composite magnetic material.

17. The integrated circuit of claim 11, wherein the plurality of magnets comprise a magnetic nano-composite (MNC) including at least one of iron-nickel (FeNi) nanowires and iron-cobalt (FeCo) nanowires.

18. The integrated circuit of claim 11, wherein the magnetic circulator operates over a microwave C-band or a microwave X-band.

19. The integrated circuit of claim 11, wherein the integrated circuit comprises a thickness of less than 150 microns ($\mu$m).

20. The integrated circuit of claim 12, wherein the active semiconductor layer is epitaxially deposited over the insulating semiconductor substrate.

* * * * *